(12) United States Patent
Endo

(10) Patent No.: US 6,642,494 B1
(45) Date of Patent: Nov. 4, 2003

(54) PHOTOELECTRIC CONVERSION APPARATUS, PRODUCTION METHOD THEREOF, AND INFORMATION PROCESSING APPARATUS HAVING THE PHOTOELECTRIC CONVERSION APPARATUS

(75) Inventor: Tadao Endo, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/363,029

(22) Filed: Jul. 29, 1999

(30) Foreign Application Priority Data

Jul. 31, 1998 (JP) .......................................... 10-217782

(51) Int. Cl.[7] .......................... H04N 3/14; H01L 27/00; H01J 1/42

(52) U.S. Cl. ................................ 250/208.1; 250/214.1; 348/302

(58) Field of Search ........................... 250/208.1, 214.1; 378/98.8; 348/281, 302, 307, 308, 314, 315; 257/249, 448

(56) References Cited

U.S. PATENT DOCUMENTS

| 5,480,812 A | * | 1/1996 | Salisbury ..................... 257/448 |
| 5,552,607 A | * | 9/1996 | Salisbury et al. ......... 250/208.1 |
| 5,801,385 A | * | 9/1998 | Endo et al. ............ 250/370.11 |
| 5,914,485 A | * | 6/1999 | Kobayashi et al. ...... 250/208.1 |

* cited by examiner

Primary Examiner—Zandra V. Smith
(74) Attorney, Agent, or Firm—Fitzpatrick, Cella, Harper & Scinto

(57) ABSTRACT

In order to solve problems of degradation of image quality and decrease of yield because of cross-talk in other signal lines where wire trouble such as a discontinuity or the like of a matrix signal wire makes a photoelectric conversion signal output inappropriate, a photoelectric conversion apparatus is provided with a photoelectric conversion circuit unit 101 in which a plurality of photoelectric conversion elements are arrayed in a matrix, and a plurality of matrix signal wires M1 to M3 for transferring parallel signals outputted from the photoelectric conversion circuit unit 101 to a reading circuit unit 107, and a matrix signal wire M2 with the wire trouble to output an abnormal signal is intentionally cut, out of the matrix signal wires arranged in a non photoelectric conversion region of the photoelectric conversion circuit unit.

26 Claims, 15 Drawing Sheets

EXAMPLE OF CROSS-TALK IMAGE

EXAMPLE OF OUTPUT AT A—B IN FIG.11A (A) } SECTIONS SUBJECTED TO CROSS-TALK
(B) }
(C)   DISCONTINUITY SECTION
(D) } SECTION SUBJECTED TO CROSS-TALK
(E) }

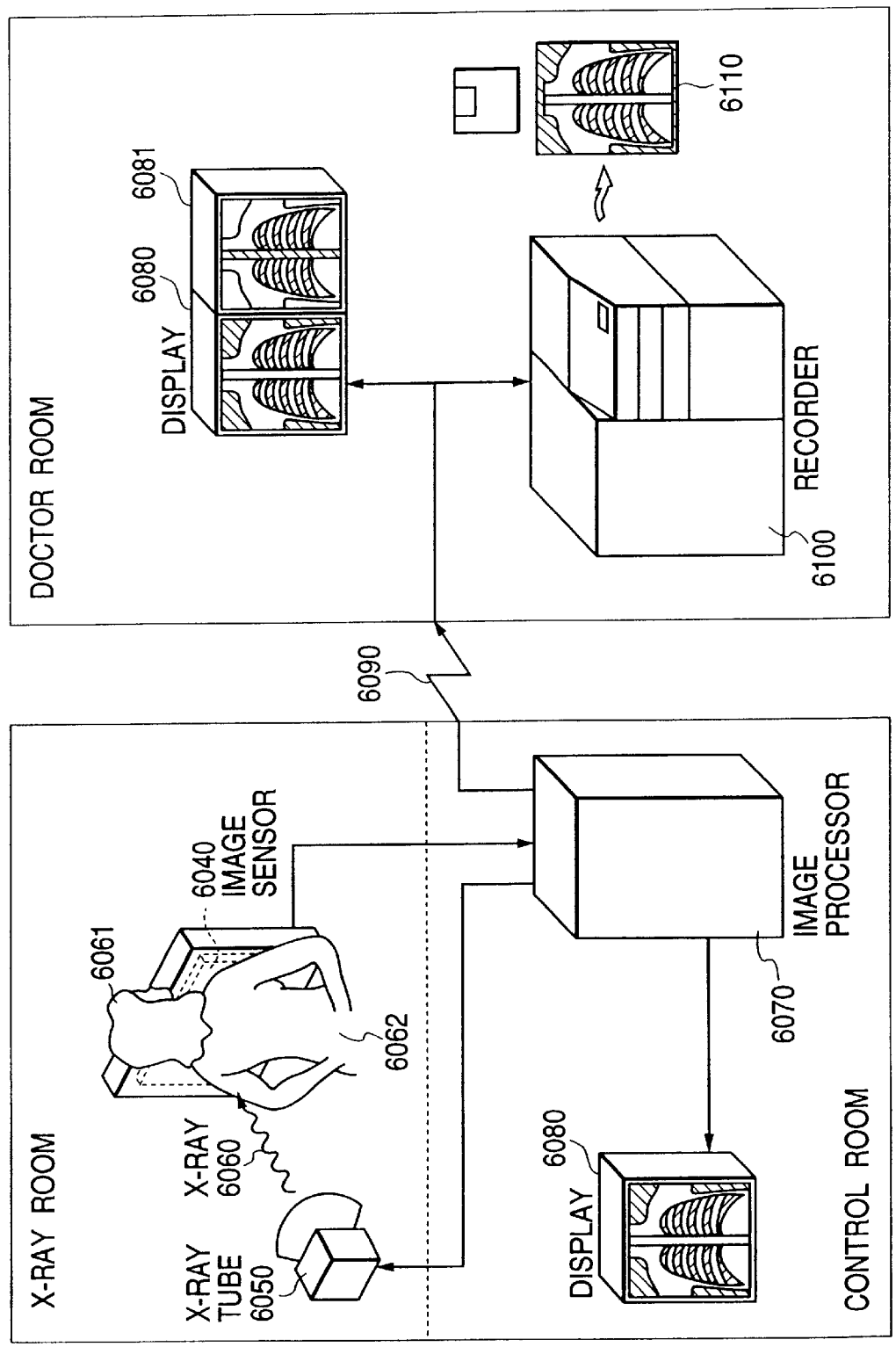

PHOTOELECTRIC CONVERSION APPARATUS, PRODUCTION METHOD THEREOF, AND INFORMATION PROCESSING APPARATUS HAVING THE PHOTOELECTRIC CONVERSION APPARATUS

BACKGROUND OF THE INVENTION

1. Field of the Invention

The present invention relates to a photoelectric conversion apparatus, a production method thereof, and an information processing apparatus having the photoelectric conversion apparatus and, more particularly, to a photoelectric conversion apparatus used in an image input unit of digital X-ray detectors and X-ray image pickup apparatus for medical use, office equipment such as digital copiers, electronic blackboards, facsimile machines, and so on, and information processing apparatus, a production method of the photoelectric conversion apparatus, and an information processing apparatus having the photoelectric conversion apparatus.

2. Related Background Art

The mainstream of the existing X-ray image pickup apparatus used for medical diagnosis is of the so-called film method in which a human body is exposed to X-rays, X-rays transmitted by the human body are made incident to a fluorescent material for converting X-rays to visible light, and a film is exposed to fluorescence emitted from the fluorescent material.

There are, however, strong desires for increase of diagnosis efficiency and for medical equipment with higher accuracy in hospitals, not only in Japan about to go into aging society, but also in the world. Under such circumstances, the conventional X-ray image pickup apparatus of the film method requires long time because of the development step of film in the way before a doctor obtains an X-ray image of a patient, and there are some cases necessitating rephotography, where the patient moved during the X-ray photography or where exposure was not correct. These are the cause of impeding increase of efficiency of medical treatment in the hospitals and would be great hindrance to movement toward new medical society in the future.

In recent years, the demand for "digitization of X-ray image information" is increasing in the medical field. Accomplishment of the digitization will permit the doctor to capture the X-ray image information of the patient at the optimal angle in real time and also permit the X-ray image information obtained to be recorded and managed by use of a medium such as a magnetooptical disk or the like. It will also becomes possible to send the X-ray image information of patient to any hospital in the world within short time by making use of facsimile or other communication method or the like.

In order to meet the demand for the "digitization of X-ray image information," the X-ray image pickup apparatus using CCD solid state image sensing elements or amorphous silicon photoelectric conversion elements in place of the film has been proposed in recent years.

FIG. 1 is an equivalent circuit diagram to show an example of an equivalent circuit of a two-dimensional photoelectric conversion apparatus. FIG. 1 shows the two-dimensional photoelectric conversion apparatus of 3×3 for simplicity of description, but the photoelectric conversion apparatus in practice is composed of much more bits, though depending upon the purpose of the apparatus.

Light incident to photoelectric conversion elements S1-1 to S3-3 is subjected to photoelectric conversion in a photoelectric conversion layer and the light information is stored in the form of a charge of a photoelectrically converted signal in a capacitor between electrodes of each photoelectric conversion element. These photoelectric conversion signals are converted to parallel voltage outputs through transfer switches T1-1 to T3-3 and matrix signal wires M1 to M3. Further, they are converted to serial signals by a reading switch circuit unit to be extracted to the outside.

In the structural example of the photoelectric conversion apparatus of FIG. 1, the photoelectric conversion elements having the total pixel number of 9 bits are divided into three rows, each row including three bits. The above-stated operations are carried out successively in every unit of these rows.

FIG. 2 is a timing chart to show the operation of the conventional photoelectric conversion apparatus illustrated in FIG. 1.

Information of light incident to the photoelectric conversion elements S1-1 to S1-3 in the first row is subjected to photoelectric conversion into signal charges and the signal charges are stored as respective interelectrode capacitances in the photoelectric conversion elements S1-1 to S1-3. After a lapse of a fixed storage time, a shift register SR1 gives the gate driving wire G1 a first voltage pulse for transfer during a period of time T1 to switch the transferring switching elements T1-1 to T1-3 on. This causes the signal charges stored in the respective electrode capacitors (S1-1 to S1-3) in the photoelectric conversion elements to be transferred through the matrix signal wires M1 to M3 to load capacitors C1 to C3, whereupon potentials V1 to V3 of the respective load capacitors are increased each by amount equal to the charge of each signal (transfer operation).

Subsequent to it, another shift register SR2 successively gives voltage pulses to gate driving wires N1 to N3 to successively switch corresponding reading switches U1 to U3 on, whereby the signals in the first row, which have been transferred to the load capacitors C1 to C3, are converted into serial signals. After impedance conversion by an operational amplifier, the signals of the three pixels are outputted to the outside of the photoelectric conversion apparatus in a period of time T3 (reading operation).

After that, a reset voltage pulse is applied to CRES for time T2 to switch reset switches RES1 to RES3 on and reset the load capacitors C1 to C3, thereby getting ready for the reading operation of the next row (reset operation).

After that, data of all the pixels is outputted by successively driving the gate driving wires G2, G3.

FIG. 3 is a schematic, sectional, structural diagram to show an example of an X-ray detecting apparatus for medical use constructed using the two-dimensional photoelectric conversion apparatus illustrated in FIG. 1. X-rays emitted from X-ray source 1501 are radiated to human body 1502 (affected part of a patient), and transmitted X-rays carrying information corresponding to internal information of lung part, bone part, or lesion travel toward a grid plate 1503. The grid plate 1503 is placed for the purpose of preventing X-rays scattered inside the human body from irradiating a fluorescent member 1504 and the photoelectric conversion apparatus 1506 and is made of a material 1507 absorbing X-rays like lead and a material 1508 transmitting X-rays like aluminum. The X-rays passing through the grid irradiate a wavelength conversion element, which is the X-ray-to-visible light converting fluorescent member 1504 in this example, to be converted to the visible light there in the sensitive wavelength region of the photoelectric conversion elements 1509. In this way the fluorescence from the X-ray-to-visible light converting fluorescent member is photoelectrically converted by the photoelectric conversion apparatus 1506. Numeral 1509 designates the photoelectric conversion elements, 1510 the switching elements, and 1511 a protective film for protecting the photoelectric conversion elements and the switching elements. Numeral 1512 denotes an insulating substrate on which the photoelectric conversion elements and the switching elements are placed.

FIG. 4A is a schematic, top plan view to show an example of the photoelectric conversion circuit unit wherein the photoelectric conversion elements and switching elements are made of amorphous silicon semiconductor thin films, and FIG. 4B is a schematic, sectional, structural diagram to show a cross section along 4B—4B in FIG. 4A. The photoelectric conversion elements 301 and the switching elements 302 (amorphous silicon TFTs, which will be referred to simply as TFTs) are formed on a common substrate 303, the lower electrodes of the photoelectric conversion elements are made of a first metal thin film layer 304 in common with the lower electrodes (gate electrodes) of the TFTs, and the upper electrodes of the photoelectric conversion elements are made of a second metal thin film layer 305 in common with the upper electrodes (the source electrodes and drain electrodes) of the TFTs. The first and second metal thin film layers are also common to the gate driving wires 306 and to the matrix signal wires 307, respectively, in the photoelectric conversion circuit unit. FIG. 4A shows the configuration having the number of pixels being totally four pixels in the matrix of 2×2. In FIG. 4A the hatched portions represent photoreceptive area surfaces of the photoelectric conversion elements. Numeral 309 represents power-source lines for supplying the bias to the photoelectric conversion elements. Numeral 310 indicates contact holes for connection between the photoelectric conversion elements and the TFTs.

Now described is a forming method of the photoelectric conversion circuit unit in the present invention.

First, chromium (Cr) is evaporated as the first metal thin film layer 304 in the thickness of about 500 Å on the insulating substrate 303 by sputtering or resistance heating, patterned by photolithography, and etched to remove unnecessary areas. This first metal thin layer 304 becomes the lower electrodes of the photoelectric conversion elements 301 and the gate electrodes of the switching elements 302. Next, a-SiNx (311), a-Si:H (312), and n$^+$ layer (313) are successively deposited in the thickness of 3000, 5000, or 1000 Å, respectively, in the same vacuum by CVD. These layers form the insulating layer/photoelectric conversion semiconductor layer/hole injection inhibiting layer of the photoelectric conversion elements 301 and the gate insulating film/semiconductor layer/ohmic contact layer of the switching elements 302 (TFTs). They are also utilized as an insulating layer at cross portions (314 in FIG. 4A) between the first metal thin film layer 304 and the second metal thin film layer 305. The thicknesses of the respective layers do not always have to be limited to the above thicknesses, and are designed so as to be optimal, depending upon the voltage in use as the photoelectric conversion apparatus, the charges, quantities of incident light on the photoreceptive surfaces of the photoelectric conversion elements, and so on. Among others, the a-SiNx layer is desirably not less than 500 Å, in which the layer can prevent electrons and holes at least from passing through and can function well as a gate insulating film of the TFTs. After the deposition of the layers, the areas to become the contact holes (310 in FIG. 4A) are dry-etched by RIE or CDE or the like and thereafter aluminum (Al) is deposited as the second metal thin film layer 305 in the thickness of about 10,000 Å by sputtering or resistance heating. The layer is further patterned by photolithography and etched to remove unnecessary areas. The second metal thin film layer becomes the upper electrodes of the photoelectric conversion elements 301, the source and drain electrodes of the switching TFTs 302, other wires, and so on. The upper and lower metal thin film layers are connected to each other at the contact hole portions at the same time as the film formation of the second metal thin film layer 305. For forming the channel portions of the TFTs, part of areas between the source electrode and the drain electrode are etched by RIE and thereafter unnecessary a-SiNx layer, a-Si:H layer, and n$^+$ layer are etched away by RIE to separate the elements from each other. This completes the photoelectric conversion elements 301, the switching TFTs 302, the other wires (306, 307, 309), and the contact hole portions 310. Although the sectional view of FIG. 4B shows only two pixels, it is a matter of course that many pixels are formed on the insulating substrate 303 at one time. Finally, the elements and wires are covered by passivation film (protective film) 315 of SiNx in order to enhance moisture resistance. As described above, the photoelectric conversion elements, switching TFTs, and wires are made of the common first metal thin film layer, a-SiNx, a-Si:H, n$^+$ layer, and second metal thin film layer deposited each at one time, and by only etching of the respective layers.

By employing the process using the amorphous silicon semiconductors as principal materials as described above, the photoelectric conversion elements, switching elements, gate driving wires, and matrix signal wires can be made at one time on the same substrate and the photoelectric conversion circuit unit of large area can be provided.

In the photoelectric conversion apparatus, since the operations of transfer, reading, and reset are normally carried out successively in every row unit as described above, the image signals from the photoelectric conversion apparatus are outputted intermittently as indicated by Vout in FIG. 2. Namely, the time necessary for reading of one row is T1+T2+T3 (FIG. 2) and the time for reading of all the bits is three times that in the case of the two-dimensional photoelectric conversion apparatus of 3×3 illustrated in FIG. 1. It is known that the size of the photoelectric conversion apparatus section 1506 of the medical X-ray image pickup apparatus illustrated in FIG. 3 needs to be about 40 cm×40 cm in the example of the X-ray image pickup apparatus for photographing the lung part. Supposing an image is formed at the pixel pitch of 100 μm, the total number of pixels will be a huge number, 4000×4000=16,000,000 pixels. If the reading operation is carried out simply in the structure illustrated in FIG. 1, the necessary time will be 4000×(T1+T2+T3). Since the time necessary for T3 is great in practice, it is common practice to provide a plurality of (N) reading circuit units and make the N reading circuit units perform the reading scan in parallel to read all the pixels in the time of 4000×(T1+T2+T3/N).

FIG. 5 is a schematic diagram of a photoelectric conversion apparatus wherein there are ten reading circuit units provided and the ten units carries out the reading scan in parallel. In this case, the reading circuit units output signals from their associated areas in time series and at the same time. Namely, ten output lines are drawn out of the respective reading circuit units.

It is, however, not easy to produce the many pixels numbering 16,000,000 without a defect of even one pixel, and defective pixels are usually compensated for by interpolation using data of normal adjacent pixels. It is not easy to make the 4000 gate wires and the 4000 matrix signal wires without a discontinuity of even one wire, either. It is thus common practice to interpolate data for outputs of pixels corresponding to a broken wire, using data of normal adjacent pixels.

The load capacitors are illustrated as capacitor elements C1 to C3 in FIG. 1, but they are actually interelectrode capacitances (Cgs) established between the gate electrodes of the switching elements and the electrodes on the matrix signal wire side. Namely, they are capacitances between the upper and lower electrodes on the signal line matrix wire side of TFTs and capacitances established in the cross portions 314 in FIG. 4A. For example, when the signal charge of S1-1 in the first row is transferred, the capacitance of the load capacitor C1 is the sum of the parasitic capacitances Cgs between the upper and lower electrodes on the signal line matrix wire side of the switching elements T1-1, T2-1, and T3-1 dependent upon the signal wire M1 and the capacitances of the respective cross portions placed near the switching elements. Likewise, for example, when the signal charge of S2-2 in the second row is transferred, the capacitance of C2 is the sum of the capacitances Cgs of the switching elements T1-2, T2-2, and T3-2 dependent on the signal wire M2 and the capacitances of the respective cross portions placed near the switching elements. In other words, for transferring a signal charge of any photoelectric conversion element, the load capacitance (C1 to C3) is the sum of three Cgs of the switching elements and three capacitances of the respective cross sections. In similar fashion, in the case of the configuration of the two-dimensional photoelectric conversion apparatus of 4000×4000 pixels, the load capacitance of each signal line in the matrix is the capacitance of (Cgs+capacitance at each cross)×4000. Let Cf represent the load capacitance (the sum of Cgs and capacitances at crosses), Ck represent the capacitance of one photoelectric conversion element, and Qt represent a stored charge. Then, the output potential Vcf after the transfer operation by TFT is given as follows; $Vcf=Qt/(Ck+Cf)$.

FIG. 6 is a top plan view of a photoelectric conversion circuit unit to show an example wherein a matrix signal wire 307 of the photoelectric conversion apparatus illustrated in FIG. 4A has a discontinuity due to anomaly (mixture of dust, foreign matter, or the like) in the film forming step or in the photolithography step. FIG. 7 is a diagram to show a schematic cross section of the circuit unit. In this case, it is impossible for TFTs to carry out the successful transfer operation to transfer the signal charge stored in the photoelectric conversion elements. When there is the discontinuity part as illustrated in FIG. 6, the signal charges of the photoelectric conversion elements up to the discontinuity part can be transferred by the TFTs, but the capacitance of the load capacitor on the matrix signal wire cannot be the normal capacitance because of the discontinuity; that is, Cf becomes small. Therefore, the output Vcf becomes large. Particularly, if the discontinuity part is close to the reading circuit unit, Cf will be very small and the output will be abnormally large. It is a matter of course that the output cannot be transferred from the photoelectric conversion elements located on the far side of the discontinuity part from the reading circuit unit. FIGS. 8(B), (C), and (D) are diagrams to show schematic output examples wherein a discontinuity is present at point B, at point C, or at point D in FIG. 5, and FIG. 8(A) is an output example wherein there is no discontinuity.

FIG. 9 is an example wherein a matrix signal wire 307 of the photoelectric conversion apparatus illustrated in FIG. 6 has a discontinuity due to anomaly (mixture of dust, foreign matter, etc.) in the film forming step or in the photolithography step, which is different from the example of FIG. 7. The difference from FIG. 7 is that the second metal thin film layer 305 forming the matrix signal wire has a discontinuity but the $n^+$ layer below the second metal thin film layer 305 is continuous. In this case, whether the TFT can perform the successful transfer operation to transfer the signal charge stored in the photoelectric conversion element, depends upon the sheet resistance of the $n^+$ layer and the length of the discontinuity of the second metal thin film layer. Specifically, when the length of the discontinuity is long enough, the behavior is similar to that in the example illustrated in FIG. 7. When the length of the discontinuity is very short, the behavior is close to that in the state without discontinuity. In the case of an intermediate discontinuity state between them, the transferred output becomes unstable from the photoelectric conversion elements on the far side of the discontinuity part from the reading circuit unit. The reset operation also becomes unstable from the reading circuit after the transfer operation.

FIG. 10 is the experiment result to show the output of the matrix signal wire in the discontinuity state of FIG. 9. The axis of abscissa is intended to indicate the length of the discontinuity, i.e., the resistance of the n layer, and in the experiment the values were measured by intentionally inserting the resistance between the matrix signal wire without discontinuity and the reading circuit unit. In the measurement the load capacitance was set to about 50 pF. As apparent from this figure, the output at small inserted resistances is equal to that in the state without discontinuity (normal output), while the output at large inserted resistances is close to that in the complete discontinuity state, i.e., the state illustrated in FIG. 7. The stored charge is not transferred in the latter case. In the intermediate range of inserted resistance, the output indicates abnormally high values. This means that there is the possibility that in the discontinuity state with existence of the $n^+$ layer as illustrated in FIG. 9 because of the anomaly (mixture of dust or foreign matter) in the film forming step or in the photolithography step, the output of the signal line could indicate abnormally high values, depending upon the degree of the discontinuity.

When there is a discontinuity in a matrix signal wire, the output of the signal wire is not used as data in the final formation step of an image and the missing data is prepared by the interpolation technology on the software basis or on the hardware basis, normally. For example, the interpolation is often carried out using outputs of adjacent matrix signal wires.

This is also the case in the example of the discontinuity shown in FIG. 7.

There is, however, the following problem. When the reading is carried out in the parallel arrangement of plural reading circuit units as illustrated in FIG. 5, the signal lines from the reading circuit units are normally read in time series and at the same time. If there is the discontinuity illustrated in FIG. 7 or FIG. 9, it will pose the problem of occurrence of so-called cross-talk to affect the adjacent reading circuit units. There are also cases wherein the cross-talk takes place even in the next reading circuit units to the adjacent units. FIG. 11A is an image example in the case of such cross-talk and FIG. 11B shows an output example along the cross section A-B of FIG. 11A. Namely, an output anomaly (c) due to the discontinuity of one line in the photoelectric conversion apparatus induces the cross-talk in several lines (a, b, d, e), which can pose the problem that there are possibilities of inducing degradation of image quality and, in turn, decreasing the yield because of failure in the compensation by interpolation.

SUMMARY OF THE INVENTION

The present invention has been accomplished in view of the above problems and an object of the present invention is to solve the problem of degradation of image quality due to the cross-talk in other signal lines, originating in a defective wire.

Another object of the present invention is to solve the problem that presence of wire trouble such as the defective wire or the like disables the whole apparatus and, as a result, make it possible to increase the yield or the like of the photoelectric conversion apparatus and to achieve reduction of cost.

A further object of the present invention is to provide an inexpensive photoelectric conversion apparatus superior in terms of the image and the yield by reducing the cross-talk in the other signal wires by interrupting electrical conduction of a signal wire corresponding to a problematic matrix signal wire in a non photoelectric conversion circuit region in the photoelectric conversion circuit unit or in a non reading circuit region in the reading circuit unit, in order to solve the problem that in the process of forming the photoelectric conversion circuit units on one substrate, the unexpected mixture of dust, foreign matter, or the like caused an unintended defect of discontinuity or the like in the matrix signal wire whereby the photoelectric conversion signal output indicated an inappropriate output value and whereby the output induced the cross-talk in the other signal lines, so as to degrade the image quality and, in turn, decrease the yield.

According to the present invention, when part of plural photoelectric conversion signal outputs from the photoelectric conversion region is inappropriate, the matrix signal wire corresponding to that signal is cut in the non photoelectric conversion region, whereby the cross-talk due to the abnormal output increase in the signal wire can be prevented in the other signal lines, so as to enhance the image quality and increase the yield.

The present invention provides a photoelectric conversion apparatus comprising:

a photoelectric conversion circuit unit in which a plurality of photoelectric conversion elements are arrayed in a matrix; and a plurality of matrix signal wires for transferring parallel signals outputted from the photoelectric conversion circuit unit to a reading circuit unit;

wherein there is an intentionally cut portion in the matrix signal wire outputting a defective signal, out of said matrix signal wires arranged in a non photoelectric conversion region of said photoelectric conversion circuit unit.

The present invention also provides a photoelectric conversion apparatus comprising:

a photoelectric conversion circuit unit for outputting parallel signals, in which a plurality of photoelectric conversion elements, switching elements, matrix signal wires, and gate driving wires are placed on one substrate; a driving circuit unit for applying a driving signal to said gate driving wires; and a reading circuit unit for converting the parallel signals transferred through said matrix signal wires to serial signals and outputting the serial signals;

said photoelectric conversion apparatus having a photoelectric conversion region in which said photoelectric conversion elements are placed, and a non photoelectric conversion region in which said matrix signal wires and said gate driving wires except for the part of said photoelectric conversion elements are placed, on said substrate, wherein there is an intentionally cut portion in the wire part in said non photoelectric conversion region, of said matrix signal wire corresponding to an inappropriate signal out of a plurality of photoelectrically converted signal outputs from said photoelectric conversion region.

The present invention also provides a production method of a photoelectric conversion apparatus, said photoelectric conversion apparatus comprising a photoelectric conversion circuit unit for outputting parallel signals, in which a plurality of photoelectric conversion elements, switching elements, matrix signal wires, and gate driving wires are placed on one substrate, a driving circuit unit for applying a driving signal to said gate driving wires, and a reading circuit unit for converting the parallel signals transferred through said matrix signal wires to serial signals and outputting the serial signals, wherein on said substrate there are a photoelectric conversion region in which said photoelectric conversion elements are placed and a non photoelectric conversion region in which said matrix signal wires and said gate driving wires except for the part of said photoelectric conversion elements are placed, said production method of the photoelectric conversion apparatus comprising such a step that when part of a plurality of photoelectric conversion signal outputs from said photoelectric conversion region is inappropriate, the matrix signal wire corresponding to said signal is cut in the non photoelectric conversion region.

The present invention also provides an information processing apparatus comprising a photoelectric conversion apparatus, said photoelectric conversion apparatus comprising:
a photoelectric conversion circuit unit in which a plurality of photoelectric conversion elements are arrayed in a matrix; and
a plurality of matrix signal wires for transferring parallel signals outputted from the photoelectric conversion circuit unit to a reading circuit unit;
said information processing apparatus further comprising a wavelength conversion element disposed on the light incidence side of said photoelectric conversion apparatus,
wherein there is an intentionally cut portion in the matrix signal wire outputting a defective signal, out of said matrix signal wires arranged in a non photoelectric conversion region of said photoelectric conversion circuit unit.

The present invention also provides an information processing apparatus comprising a photoelectric conversion apparatus, said photoelectric conversion apparatus comprising a photoelectric conversion circuit unit for outputting parallel signals, in which a plurality of photoelectric conversion elements, switching elements, matrix signal wires, and gate driving wires are placed on one substrate; a driving circuit unit for applying a driving signal to said gate driving wires; and a reading circuit unit for converting the parallel signals transferred through said matrix signal wires to serial signals and outputting the serial signals;

said photoelectric conversion apparatus having a photoelectric conversion region in which said photoelectric conversion elements are placed, and a non photoelectric conversion region in which said matrix signal wires and said gate driving wires except for the part of said photoelectric conversion elements are placed, on said substrate, said information processing apparatus further comprising a wavelength conversion element disposed on the light incidence side of said photoelectric conversion apparatus, wherein there is an intentionally cut portion in the wire part in said non photoelectric conversion region, of said matrix signal wire corresponding to an inappropriate signal, out of a plurality of photoelectrically converted signal outputs from said photoelectric conversion region.

The present invention also provides a photoelectric conversion apparatus comprising a photoelectric conversion circuit in which a plurality of photoelectric conversion elements are arrayed in a matrix, a plurality of matrix signal lines for transferring output signals from the photoelectric conversion circuit, and a reading circuit to which said output signals are transferred, wherein electrical conduction is interrupted outside the photoelectric conversion circuit between a matrix signal wire having wire trouble and the reading circuit.

The present invention also provides an information processing apparatus comprising a photoelectric conversion apparatus, said photoelectric conversion apparatus comprising a photoelectric conversion circuit in which a plurality of photoelectric conversion elements are arrayed in a matrix, a plurality of matrix signal lines for transferring output signals from the photoelectric conversion circuit, and a reading circuit to which said output signals are transferred, said information processing apparatus further comprising a wavelength conversion element disposed on the light incidence side of the photoelectric conversion apparatus, wherein electrical conduction is interrupted outside the photoelectric conversion circuit between a matrix signal wire having wire trouble and the reading circuit.

The present invention also provides a production method of a photoelectric conversion apparatus, said photoelectric conversion apparatus comprising a photoelectric conversion circuit in which a plurality of photoelectric conversion elements are arrayed in a matrix, a plurality of matrix signal lines for transferring output signals from the photoelectric conversion circuit, and a reading circuit to which said output signals are transferred, said production method comprising such a step that electrical conduction is interrupted outside the photoelectric conversion circuit between a matrix signal wire having a wire trouble and the reading circuit.

BRIEF DESCRIPTION OF THE DRAWINGS

FIG. 12 is a schematic circuit diagram to show a preferred example of the photoelectric conversion apparatus in which the photoelectric conversion circuit with the wire trouble has been dealt with;

FIG. 16 is a schematic circuit diagram to show another preferred example of the photoelectric conversion apparatus in which the photoelectric conversion circuit with the wire trouble has been dealt with; and FIG. 17 is a schematic, structural diagram to show an example of the information processing apparatus having the photoelectric conversion apparatus of the present invention.

DESCRIPTION OF THE PREFERRED EMBODIMENTS

The embodiments of the present invention will be described in detail with reference to the drawings.

Embodiment 1

Figure 1:
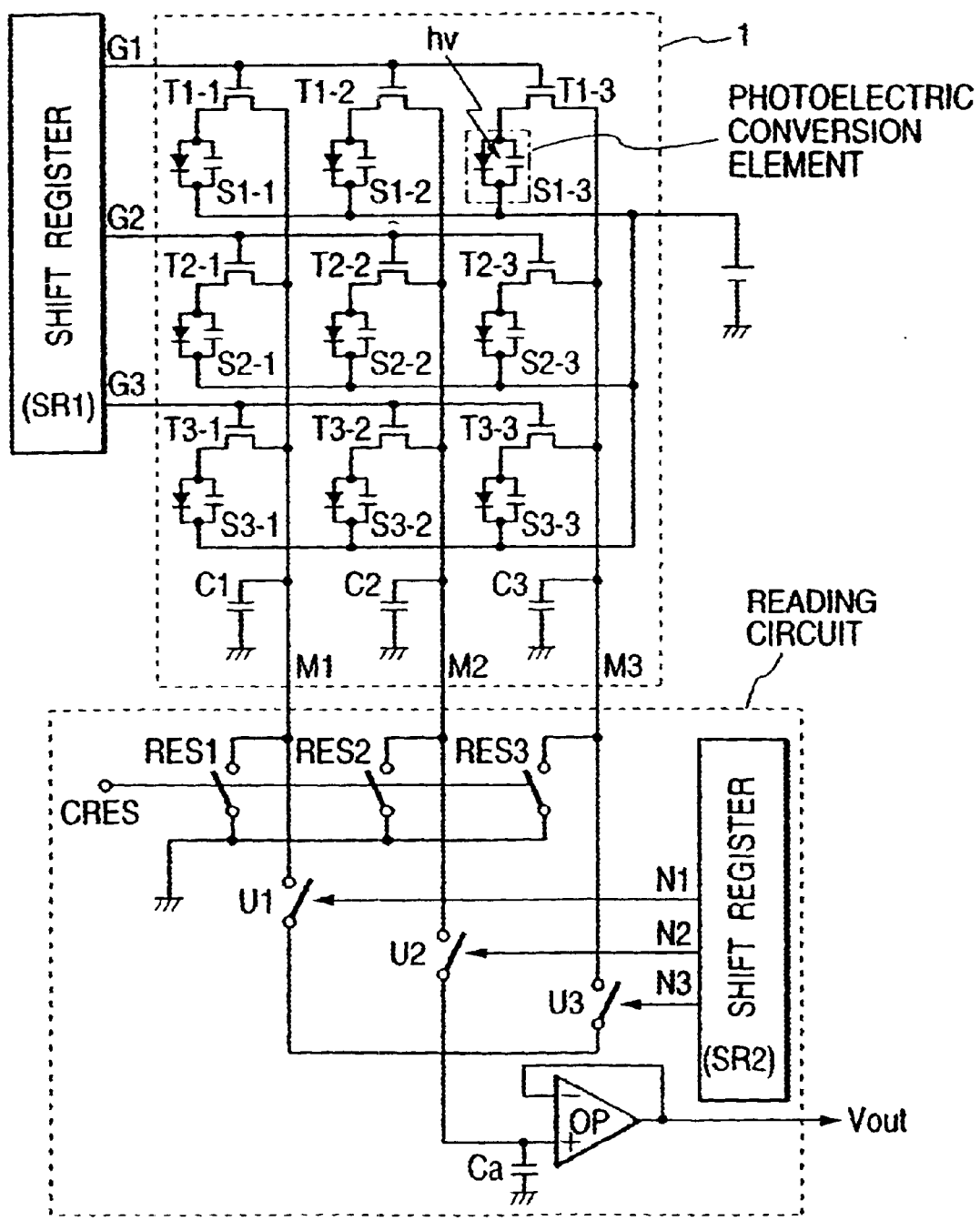
FIG. 1 is a schematic circuit diagram for explaining an example of the circuit structure of the photoelectric conversion apparatus.
Figure 2:
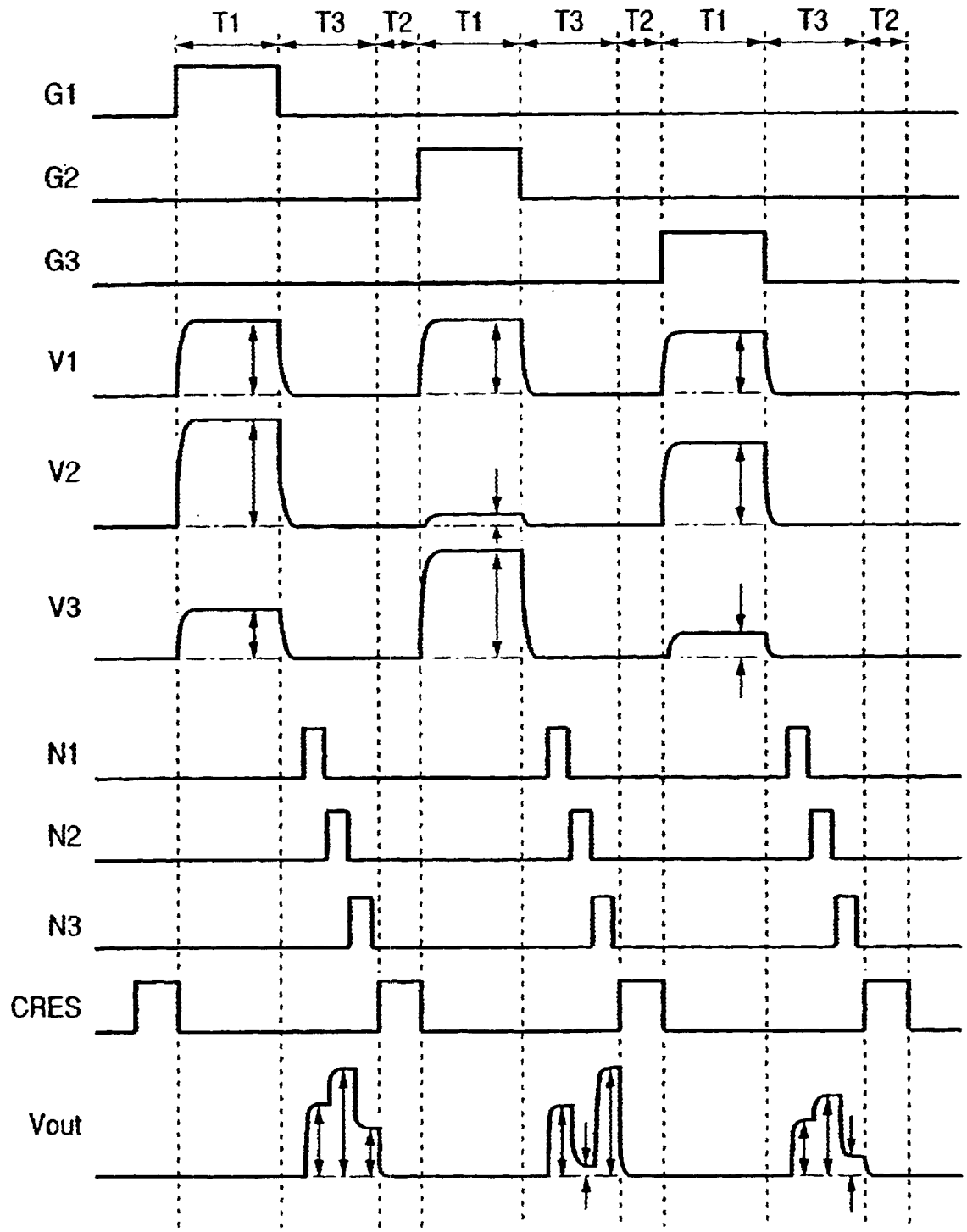
FIG. 2 is a timing chart for explaining an example of the operation timing of the photoelectric conversion apparatus.
Figure 3:
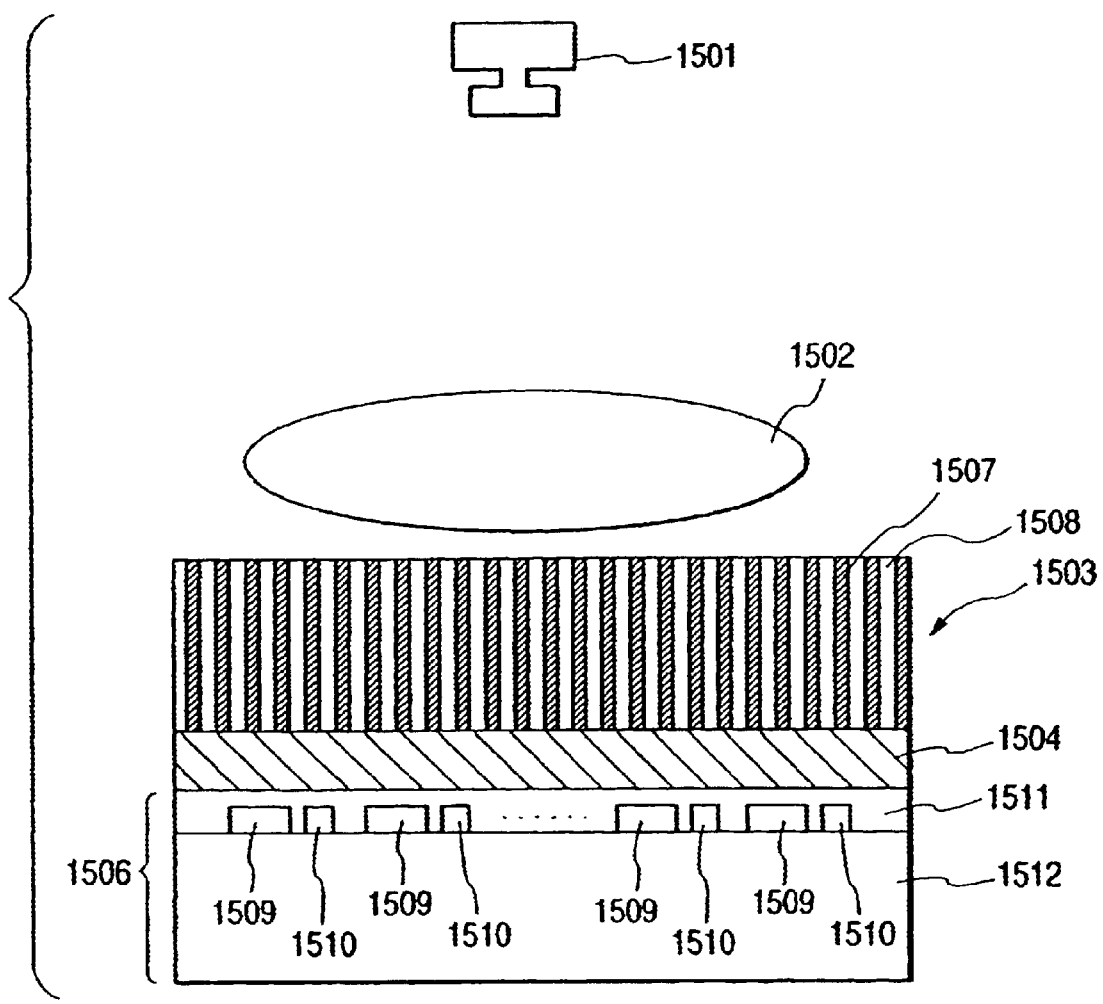
FIG. 3 is a schematic, sectional, structural diagram to show a structural example of the X-ray image pickup apparatus as an example of the information processing apparatus.
Figure 4A:
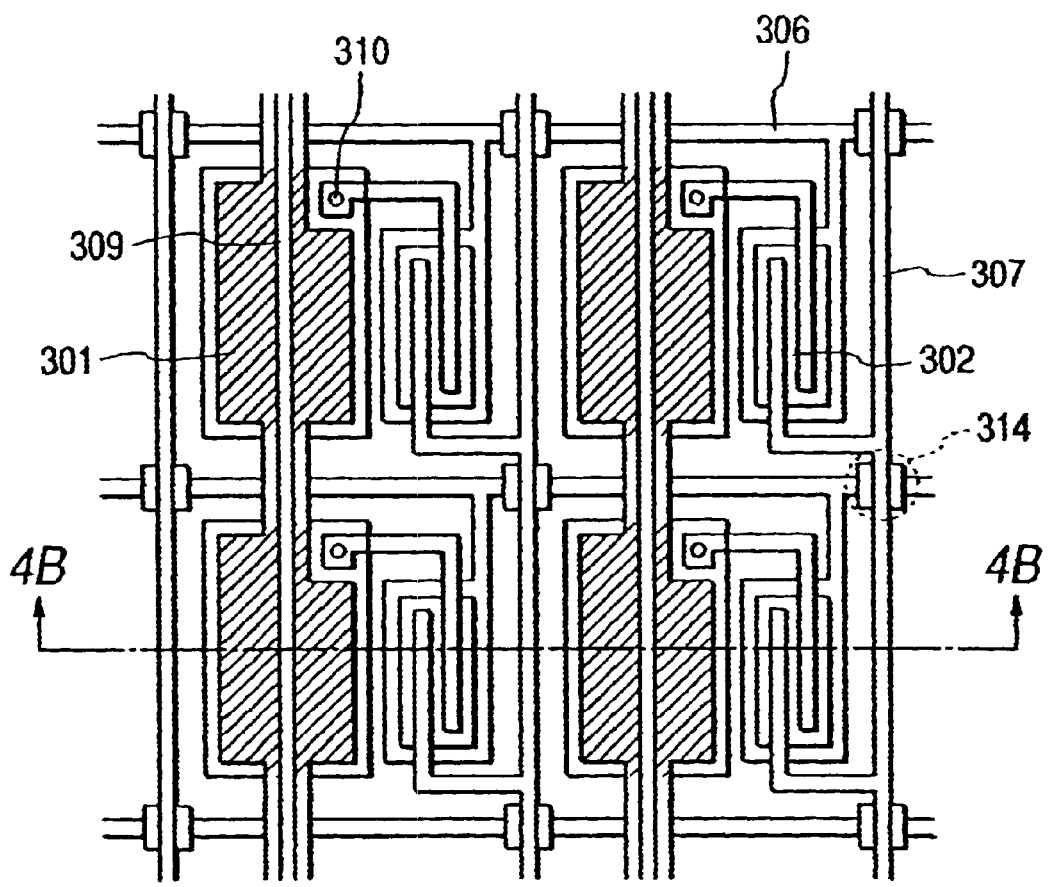
FIG. 4A is a schematic, top plan view of a photoelectric conversion circuit.
Figure 4B:
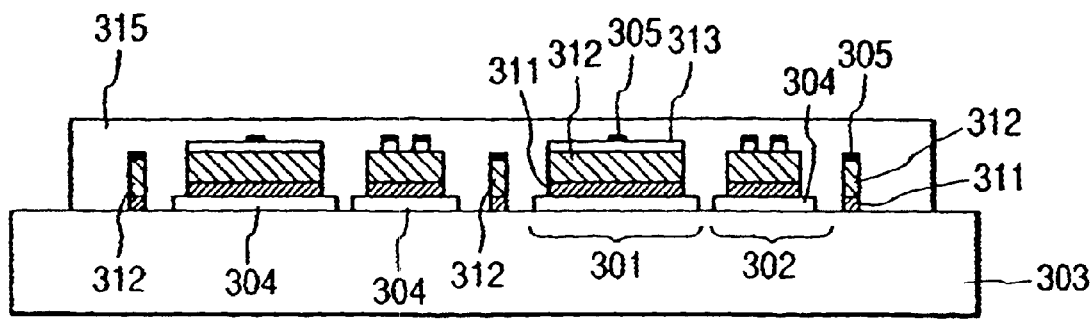
FIG. 4B is a schematic, sectional view along 4B—4B in FIG. 4A.
Figure 12:
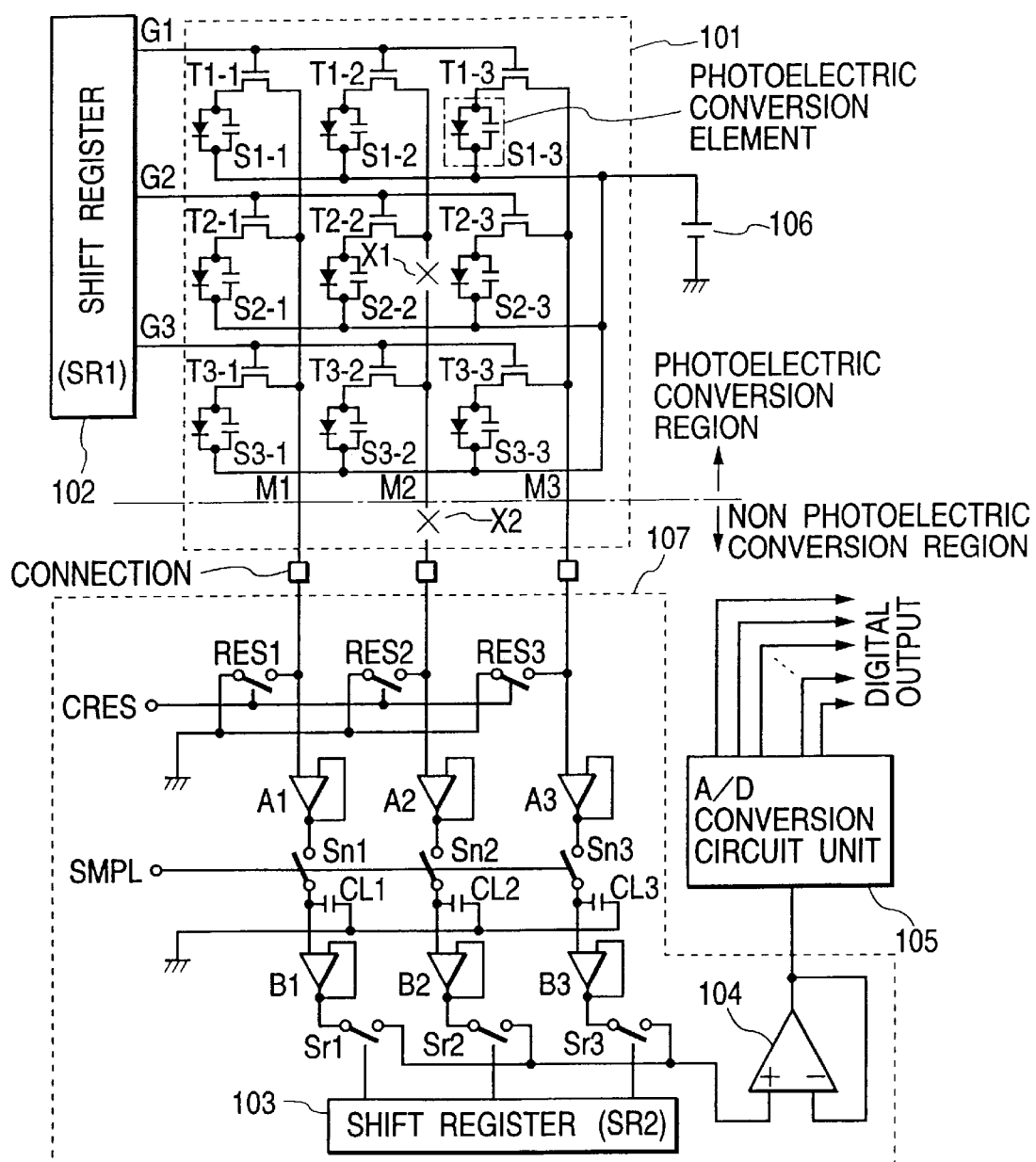

FIG. 12 is a schematic circuit diagram to show an example of the circuit of the photoelectric conversion apparatus according to the present invention. For simplifying the description, the apparatus is composed of totally nine pixels of 3×3 in the figure. Further, like symbols are used for the same members as those in FIG. 1. Symbols S1-1 to S3-3 represent the photoelectric conversion elements for receiving the visible light and converting it into an electric signal, and T1-1 to T3-3 the switching elements for transferring the signal charges photoelectrically converted in S1-1 to S3-3 to the side of the matrix signal wires M1 to M3. Symbols G1 to G3 indicate wires connected to the switching elements T1-1 to T3-3, for driving the gates of the switches. The matrix signal wire M1 has a capacitance as addition of three interelectrode capacitances (Cgs) of the switching elements and three capacitances established at the cross portions, as also described in the conventional example. The capacitance is not illustrated as a capacitor element in FIG. 12. This above is also the case as to the other matrix signal wires M2, M3.

The photoelectric conversion elements S1-1 to S3-3, the switching elements T1-1 to T3-3, the gate driving wires G1 to G3, and the matrix signal wires M1 to M3 are located in the photoelectric conversion circuit unit 101 in the figure and are normally placed on an insulating substrate, though not illustrated. Numeral 102 denotes a driving circuit unit comprised of a shift register (SR1) for opening and closing the switching elements T1-1 to T3-3. Symbols A1 to A3 represent operational amplifiers for amplifying the signal charges of the matrix signal wires M1 to M3 to effect impedance conversion, which are illustrated only as buffer amplifiers in the figure. Symbols Sn1 to Sn3 indicate transfer switches for transferring the output of the operational amplifiers A1 to A3, which is the output of each matrix signal wire M1 to M3, to respective capacitors CL1 to CL3. The reading capacitors CL1 to CL3 are read through buffer amplifiers B1 to B3 by corresponding reading switches Sr1 to Sr3. Numeral 103 is a shift register (SR2) for switching the reading switches Sr1 to Sr3. The parallel signals of CL1 to CL3 are converted into serial signals by Sr1 to Sr3 and SR2, which are inputted into a final-stage operational amplifier 104 and then are digitized by A/D conversion circuit unit 105. Symbols RES1 to RES3 denote reset switches for resetting the signal components stored in the capacitors on the matrix signal wires and the capacitors are reset to a certain reset potential by a pulse from the CRES terminal (they are reset to the GND potential in the figure). Numeral 106 denotes a power source for supplying the bias to the photoelectric conversion elements S1-1 to S3-3.

The reading circuit unit 107 is composed of the buffer amplifiers A1 to A3, transfer switches Sn1 to Sn3, reading capacitors CL1 to CL3, buffer amplifiers B1 to B3, reading switches Sr1 to Sr3, shift register SR2, final-stage operational amplifier 104, and reset switches RES1 to RES3.

FIG. 12 shows the example in which the matrix signal wire M2 in the photoelectric conversion circuit unit 101 is discontinuous near the photoelectric conversion element S2-2, and the discontinuity part is indicated by "x" (X1) in the figure. This discontinuity part is a defect unavoidably caused by unexpected mixture of dust or foreign matter in the film forming step or in the photolithography step for forming the photoelectric conversion circuit unit.

There is a portion indicated by "x" part (X2) on the matrix signal wire M2 in an area between the photoelectric conversion circuit unit and the reading circuit unit in FIG. 12, and this portion indicated by "x" (X2) is a portion intentionally cut, which is the feature of the present invention.

Although this cut part "x" (X2) is illustrated at the position of indication on the electric circuit diagram of FIG. 12, it is noted that the wire is not cut in the photoelectric conversion region (which is considered as an area in which the subject can exist) in which the photoelectric conversion elements and the switching elements in the photoelectric conversion circuit unit are arranged in a two-dimensional array on the pattern, but the wire is intentionally cut in the range outside the photoelectric conversion region and before the connections to the reading circuit unit, i.e., in the non photoelectric conversion region. A cutting method is to thermally fuse the wire with laser light using the $CO_2$ gas laser, the YAG laser, the excimer laser or.the like. Alternatively, the portion desired to cut may also be dissolved with an etchant for the metal thin film layer forming the matrix signal wire or, depending upon circumstances, may also be shaved off by a sharp edge like a cutter.

Figure 13:
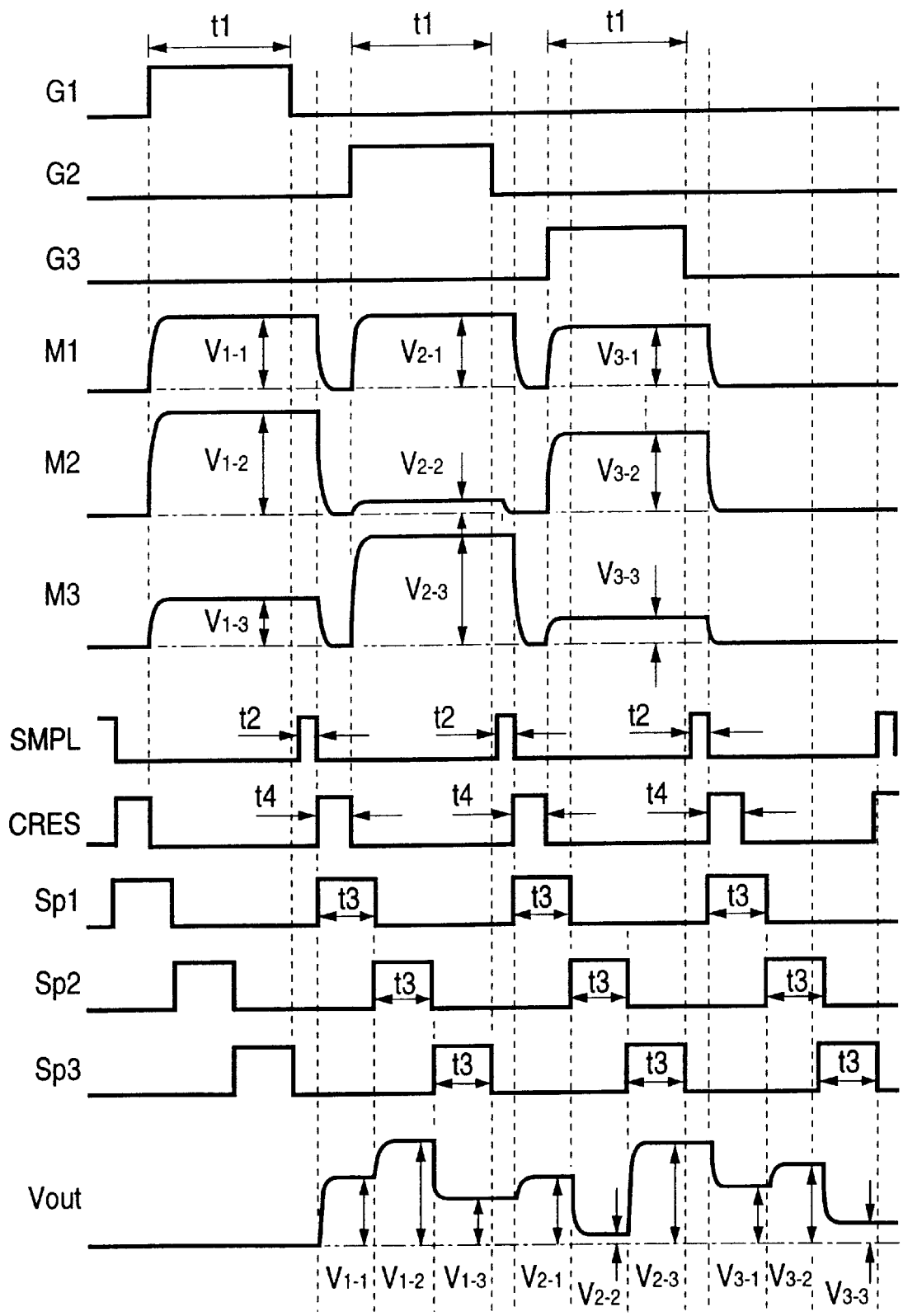
FIG. 13 is a timing chart to show an example of operation and output where the photoelectric conversion circuit has no wire trouble.

FIG. 13 is a timing chart to show an example of the operation of the photoelectric conversion apparatus illustrated in FIG. 12. The details of the operation will be described on the presumption that there is no unexpected discontinuity portion "x" (X1) on the matrix signal wire M2 and no intentionally cut part "x" (X2). The signal charges photoelectrically converted in the photoelectric conversion elements S1-1 to S3-3 are stored during a fixed period in the capacitor components established in the photoelectric conversion elements. While the switching elements T1-1 to T1-3 are turned "ON" during the period of time t1 by a gate pulse signal G1 of SR1, the signal charges stored in the photoelectric conversion elements S1-1 to S1-3 in the first row are transferred to the respective capacitor components established in the matrix signal wires M1 to M3.

In FIG. 13, M1 to M3 indicate a state of the transfer to show an example of different signal quantities stored in the respective photoelectric conversion elements. Namely, in the photoelectric conversion elements (S1-1 to S1-3) of the first row, the output levels thereof are in the relation of S1-2>S1-1>S1-3. The output signals of the matrix signal wires are subjected to the impedance conversion by the respective operational amplifiers A1 to A3. After that, the switching elements Sn1 to Sn3 in the reading circuit unit are turned "ON" during the period of time t2 by a pulse SMPL illustrated in FIG. 13, whereby the signals are transferred to the respective reading capacitors CL1 to CL3. The signals of the reading capacitors CL1 to CL3 are subjected to the impedance conversion by the respective buffer amplifiers B1 to B3. After that, the reading switches Sr1 to Sr3 are successively turned "ON" by shift pulses Sp1 to Sp3 from SR2, whereby the parallel signal charges, having been transferred to the reading capacitors CL1 to CL3, are converted into serial signals to be read out. Supposing the pulse widths of the shift pulses of Sp1, Sp2, Sp3 are set as Sp1=Sp2=Sp3=t3, the time necessary for this serial conversion and reading is t3×3. The serial signals thus converted are outputted from the final-stage operational amplifier 104 and are further digitized by the A/D conversion circuit unit 105.

Vout illustrated in FIG. 13 represents the analog signals before entry into the A/D conversion circuit unit. As illustrated in FIG. 13, the parallel signals of S1-1 to S1-3 of the first row, which are the parallel signals of signal potentials M1 to M3 of the matrix signal wires, are converted into the serial signals on the Vout signal in proportion to magnitudes of those signals. Finally, the signal potentials of M1 to M3 are reset to the fixed reset potential (the GND potential) through the reset switching elements RES1 to RES3 by "ON" of a CRES pulse during the period of time t4, so as to become ready for the transfer of signal charges of the next photoelectric conversion elements S2-1 to S2-3 in the second row. Subsequent to it, the photoelectrically converted signals of the second row and the third row are read out repeatedly in similar fashion.

Figure 14:
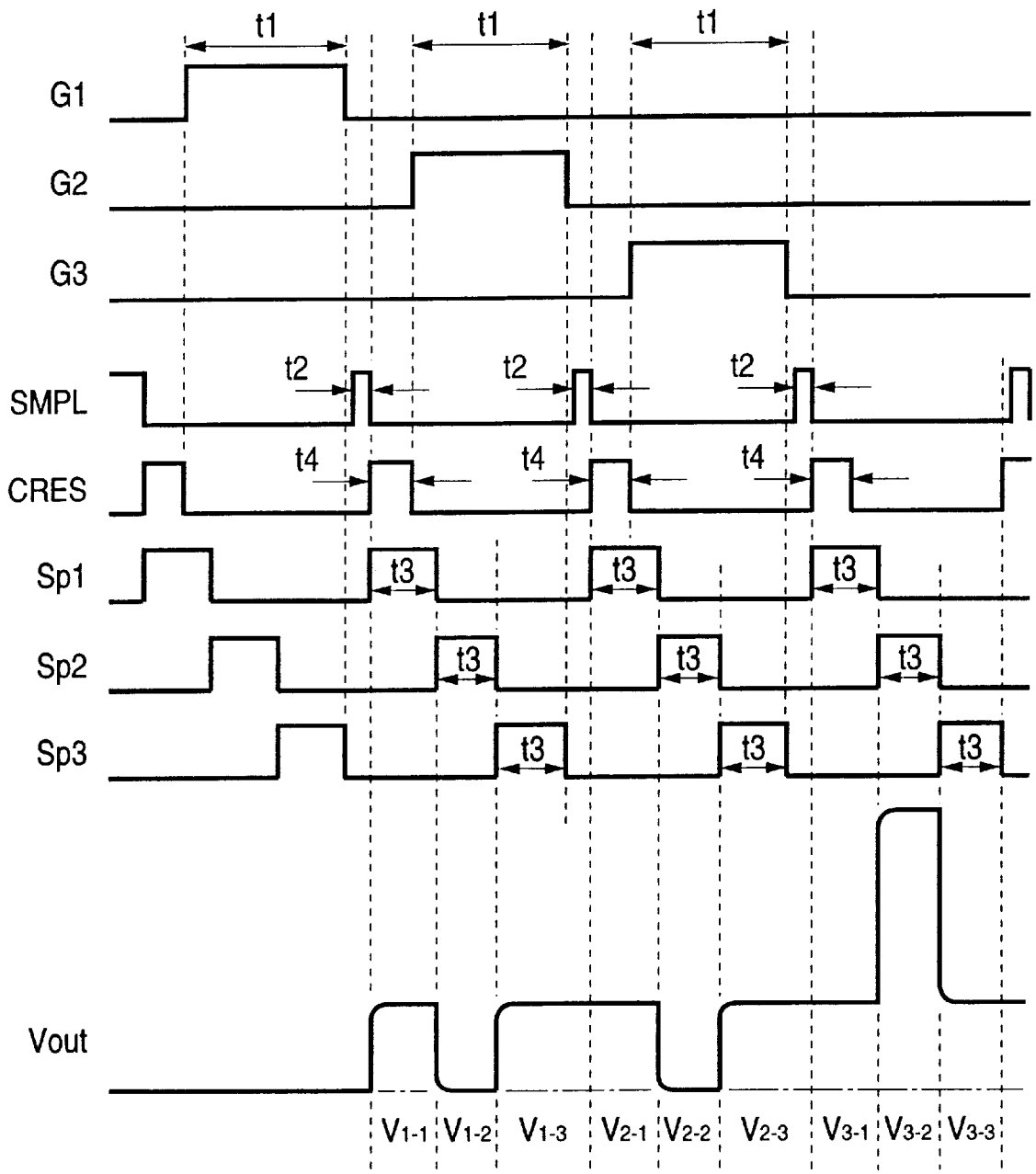
FIG. 14 is a timing chart to show an example of operation and output where the photoelectric conversion circuit has the wire trouble.

FIG. 14 shows an example of the timing chart on the presumption that there is the unexpected discontinuity part "x" (X1) (discontinuous) in the photoelectric conversion region in FIG. 12 and there is no intentionally cut part "x" (X2) (continuous) in the non photoelectric conversion region.

FIG. 13 shows the timing chart on the presumption that there are the different inputs to the respective pixels, including bright pixels with more input of light, dark pixels with less light, and intermediate pixels with intermediate brightness, and so on, whereas FIG. 14 shows the timing chart on the presumption that constant light is incident to all the pixels in order to facilitate understanding of the description. The timing chart is illustrated on the assumption that the unexpected discontinuity part "x" on the matrix signal wire M2 is a completely open part (high impedance state) without existence of the $n^+$ layer.

Figure 5:
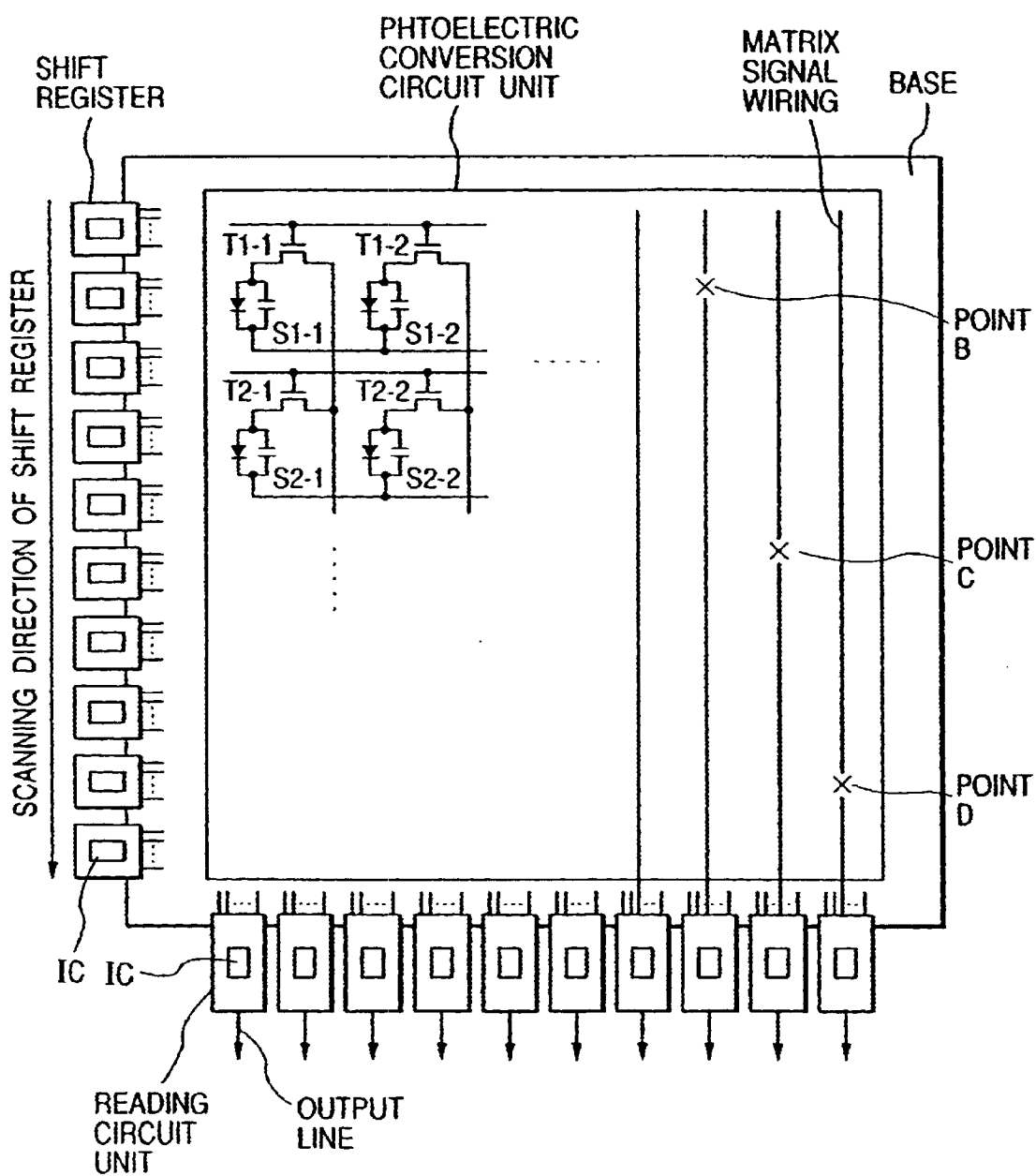
FIG. 5 is a schematic plan view for explaining an example of the structure of the photoelectric conversion apparatus.
Figure 6:
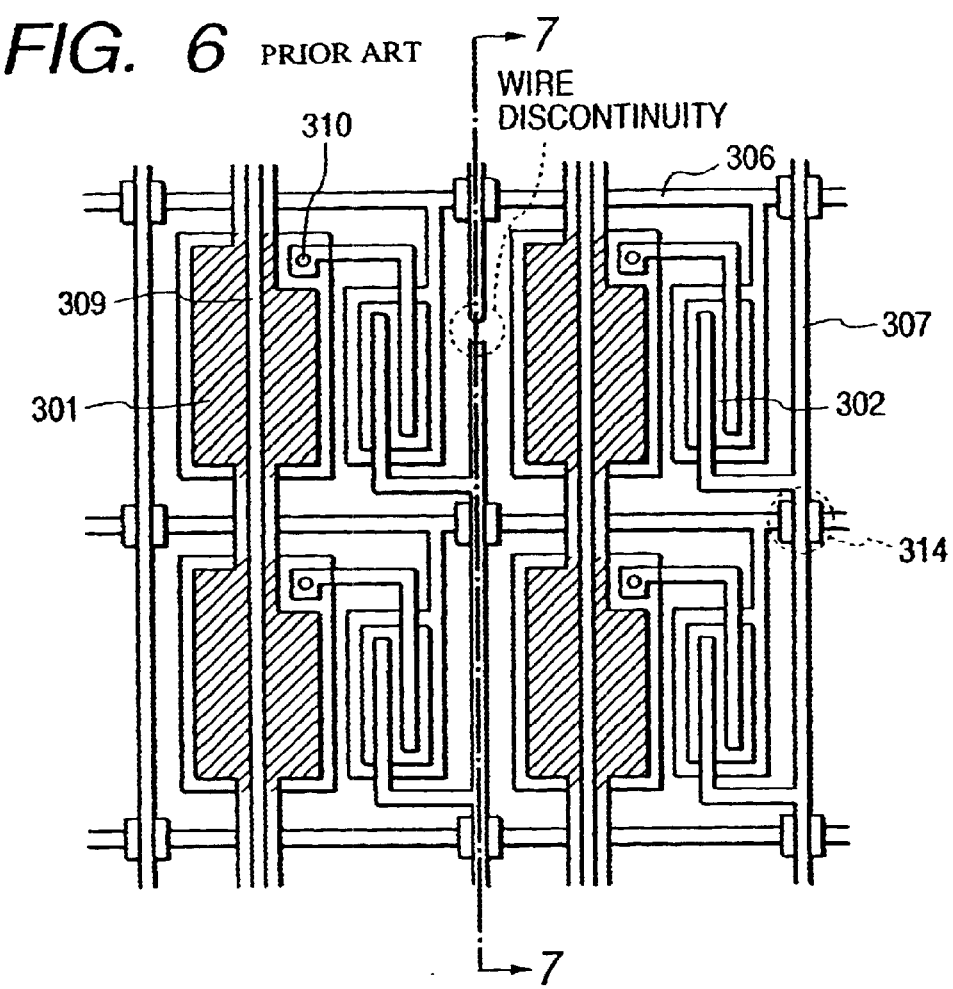
FIG. 6 is a schematic, top plan view for explaining an example of the wire trouble.
Figure 7:
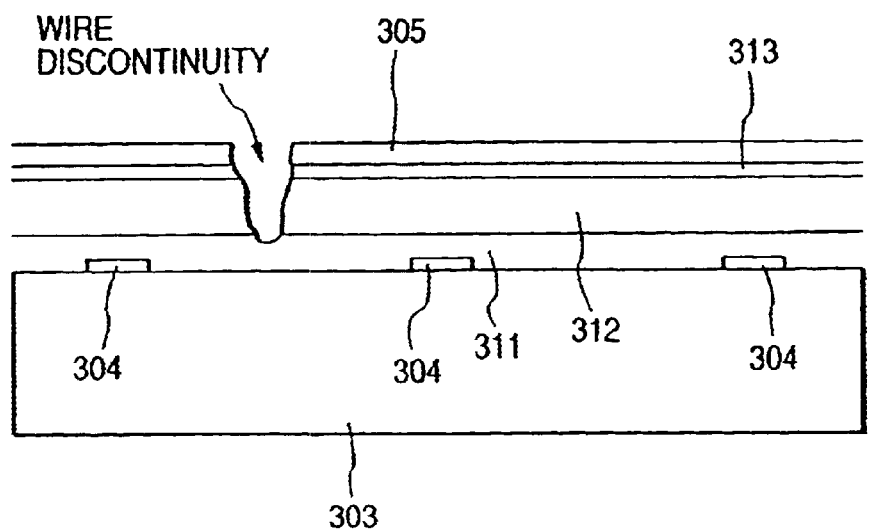
FIG. 7 is a schematic, sectional view for explaining an example of the wire trouble.
Figure 8:
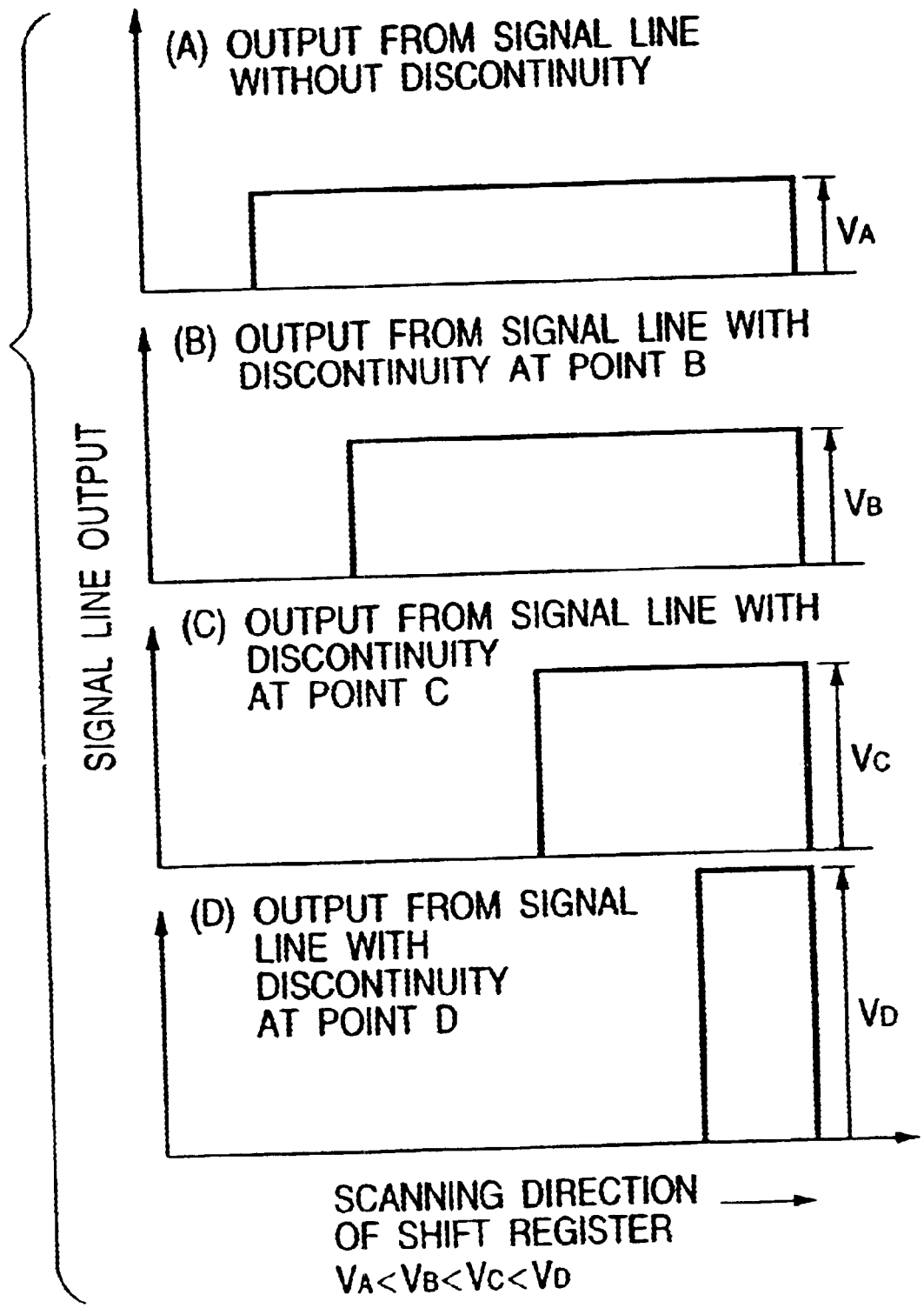
FIG. 8 is diagrams for explaining output examples from the photoelectric conversion circuit having the wire trouble.
Figure 11A:
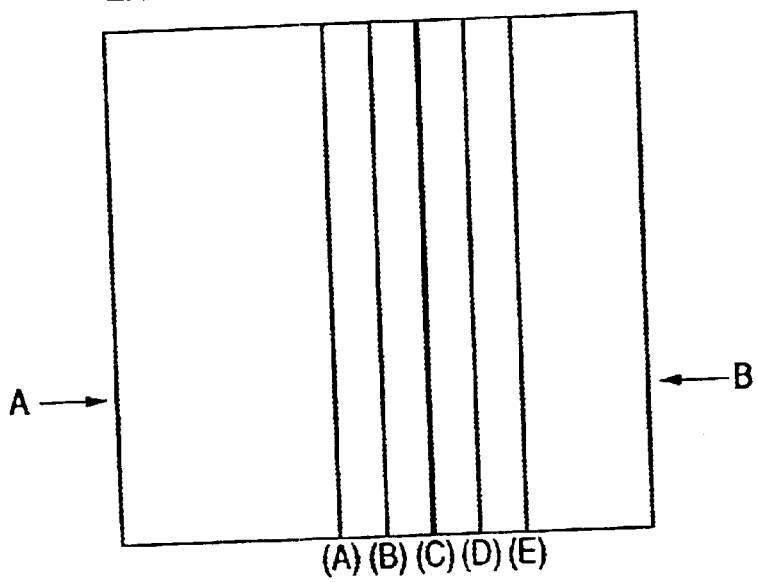
FIG. 11A is a diagram to show an image example based on the signals from the photoelectric conversion circuit with the wire trouble.
Figure 11B:
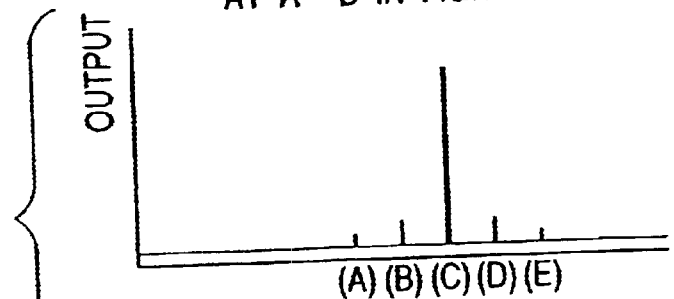
FIG. 11B is a diagram to show an example of output distribution along A-B in FIG. 11A.

It is seen from Vout of FIG. 14 that the stored signal charges are not transferred via the switching elements T1-2 and T2-2 from the pixels on the far side of the discontinuity part from the reading circuit unit and thus their signal level is low. As for the pixel on the reading circuit unit side of the discontinuity part, the stored signal charge of the photoelectric conversion element S3-2 is transferred via the switching element T3-2 on the other hand, but the output voltage value is increased, because the total reading capacitance added in the matrix signal wire M2 is decreased because of the discontinuity at the part "x." In such cases, the signal of M2 induces the cross-talk in the other signal wires between the signal wires in the reading circuit unit, so as to result in negatively affecting the outputs of the normal matrix signal wires. Since the example of FIG. 14 is explained in the configuration of nine pixels of 3×3, it is difficult to properly explain the extent of the problem, but, for example, where the photoelectric conversion apparatus is composed of many pixels of 4000×4000 and a plurality of (ten) reading circuit units as illustrated in FIG. 5, the cross-talk occurs between the output signal wires from the reading circuit units. Namely, the resultant image is the one as illustrated in FIG. 11A.

Particularly, where the discontinuity part in the photoelectric conversion region, which unavoidably occurred because of the unexpected mixture of dust or foreign matter in the photoelectric conversion region, is close to the reading circuit units, the output of the pixels on the reading circuit unit side of the discontinuity part becomes extremely large, so as to increase amounts of the cross-talk considerably.

Figure 15:
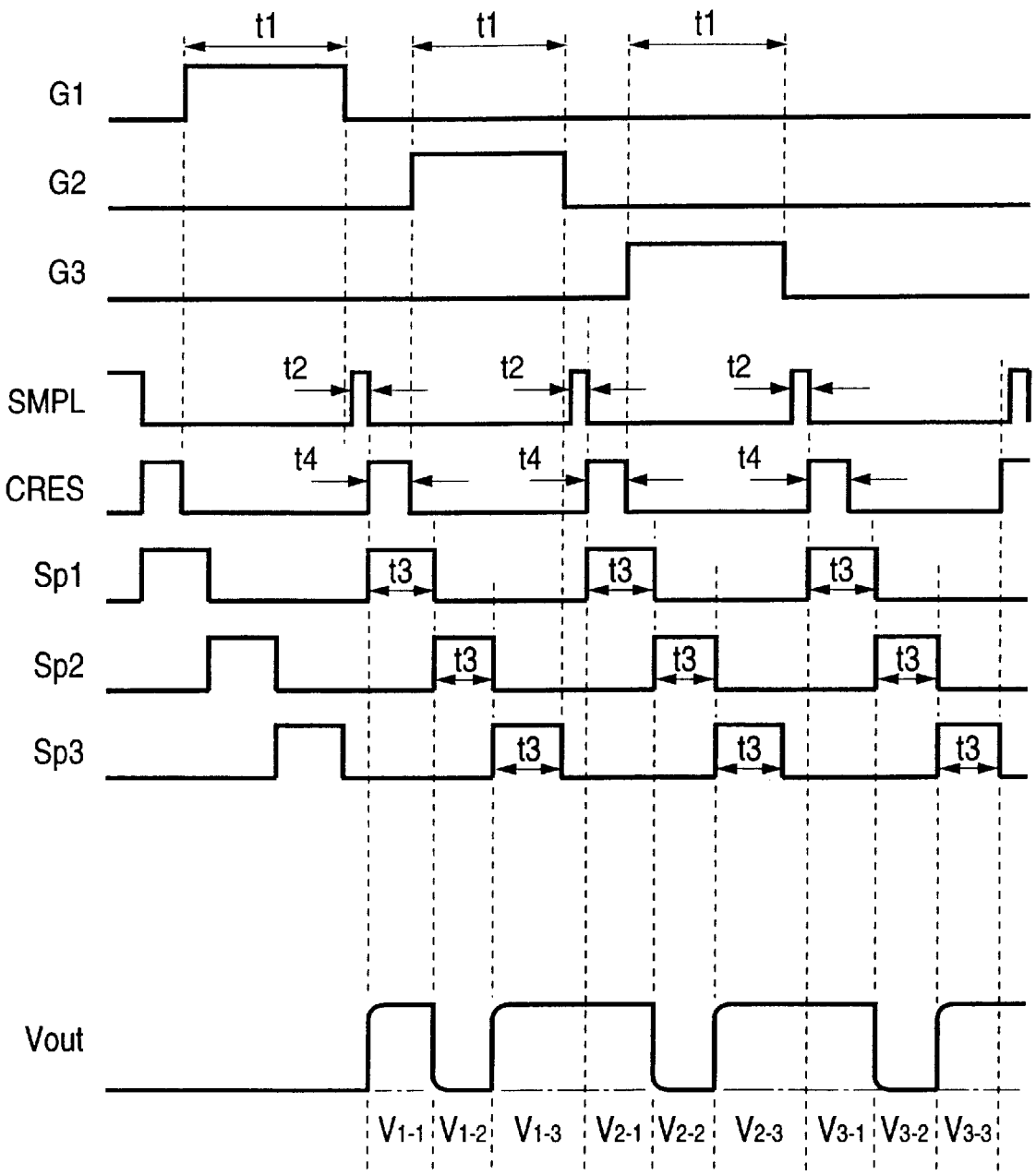
FIG. 15 is a timing chart to show an example of operation and output after the wire trouble is handled.

FIG. 15 shows an example of the timing chart obtained on the assumption that there exists the unexpected discontinuity part "x" (discontinuous) in the photoelectric conversion region in FIG. 12 and there is the intentionally cut part "x" in the non photoelectric conversion region. As apparent from FIG. 15, the signal charges stored in the photoelectric conversion elements S1-2, S2-2, S3-2 connected to the matrix signal wire M2 are not transferred, so that they do not appear as an output. This results in suppressing the influence of the cross-talk from the signal line of interest on the other signal lines and, in turn, improving the quality of image.

The missing data of the pixels connected to the matrix signal wire thus cut can be compensated for on the software basis or on the hardware basis by the interpolation process or correction using the data of adjacent pixels.

Figure 9:
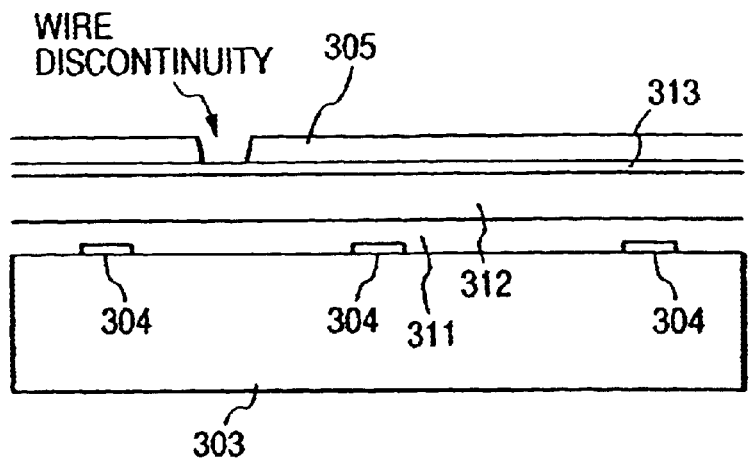
FIG. 9 is a schematic, sectional view for explaining an example of the wire trouble.
Figure 10:
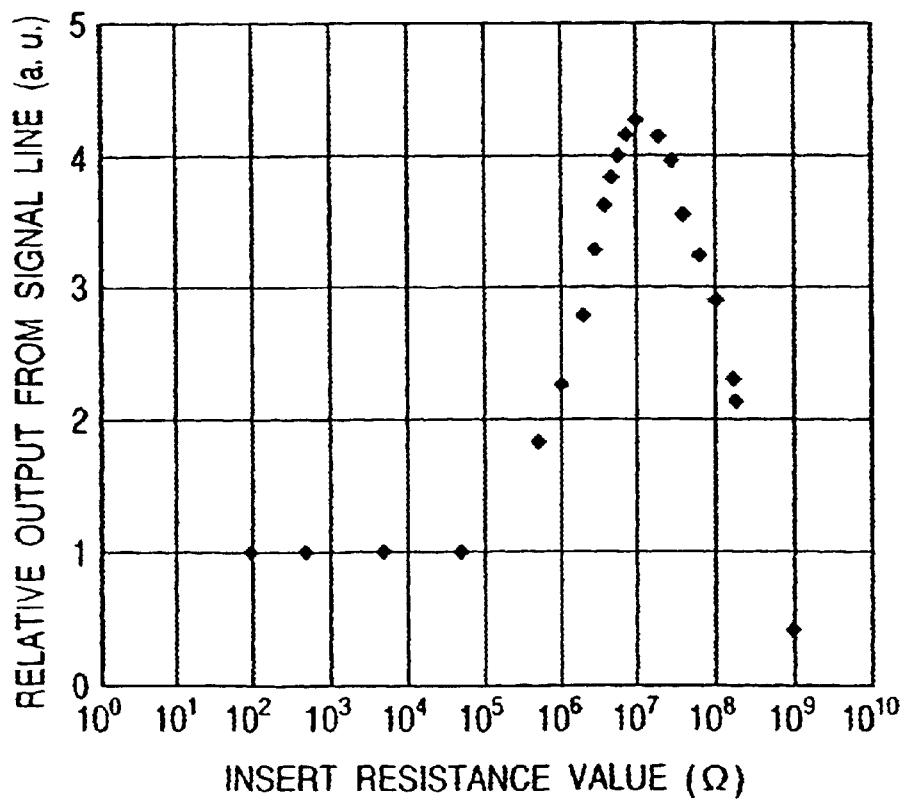
FIG. 10 is a diagram to show an example of the relation between wire trouble and signal output.

The description of FIG. 12 to FIG. 15 is based on the presumption that the unexpected discontinuity part "x" on the matrix signal wire M is completely open (in the high impedance state) with absence of the $n^+$ layer, and, even in cases where the second metal thin film layer is discontinuous with presence of the $n^+$ layer as illustrated in FIG. 9, the same effect can be achieved by intentionally cutting the matrix signal wire in the region except for the photoelectric conversion region, i.e., in the non photoelectric conversion region. The effect is exactly the same as in the above description.

Embodiment 2

Figure 16:
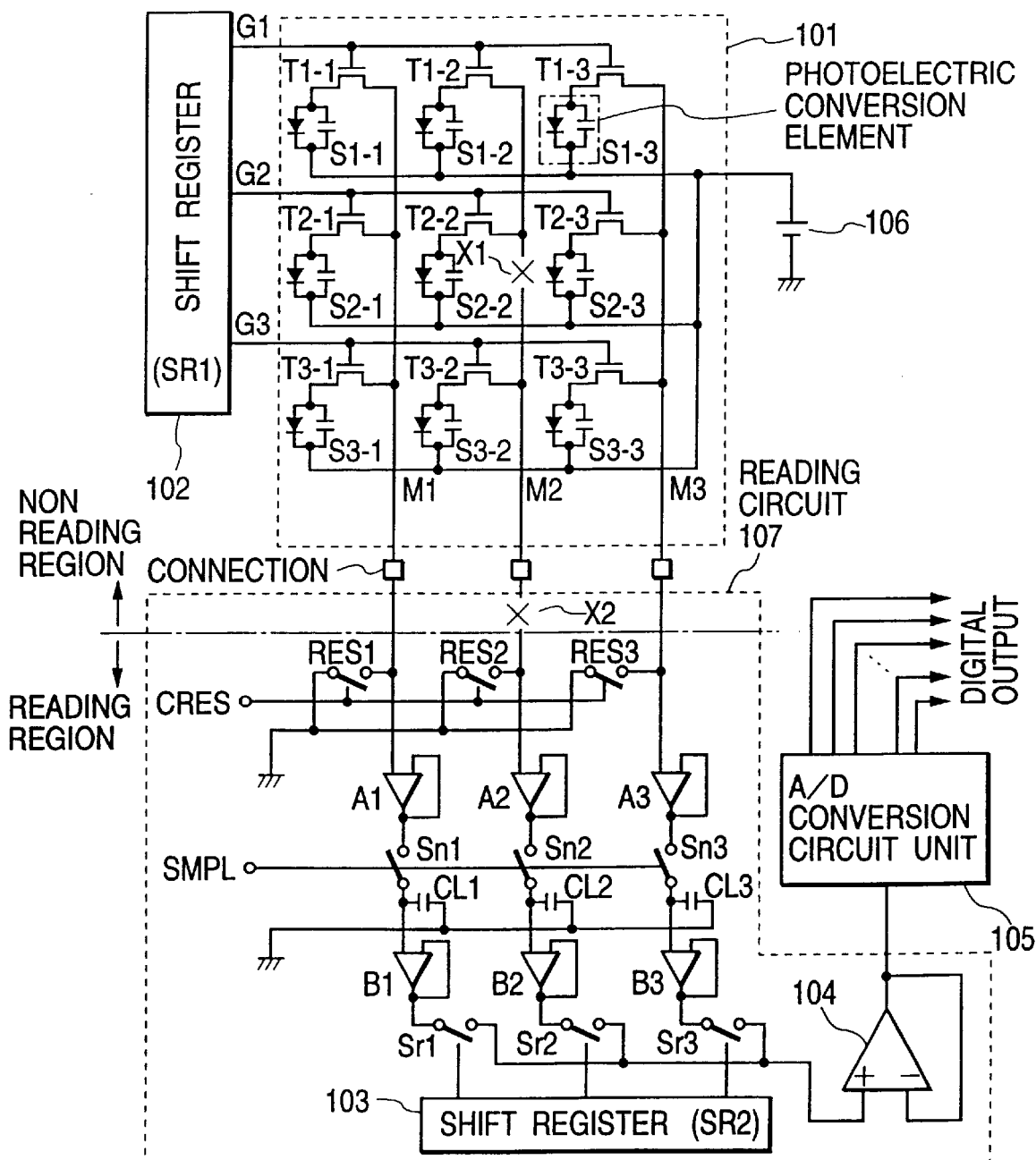

FIG. 16 is a schematic circuit diagram for explaining another example of the photoelectric conversion apparatus of the present invention. For simplifying the description, the apparatus is composed of totally nine pixels of 3×3 in the figure. Like symbols are used for the same materials as those in FIG. 12. FIG. 16 is different from FIG. 12 in that with occurrence of the unexpected discontinuity part "x" (X1), similar to FIG. 12, on a matrix signal wire in the photoelectric conversion region in the photoelectric conversion circuit unit, the matrix signal wire or a wire connected thereto is intentionally cut by the excimer laser or the like at the cut position ("x in the figure" (X2)) different from that in FIG. 12.

In FIG. 16, the cut portion is not located inside the photoelectric conversion circuit unit, but is located inside the reading circuit unit. In the reading circuit unit 107 there are a reading circuit region for converting the parallel signals transferred from the matrix signal wires to serial signals and outputting the serial signals, and a non reading circuit region in which the wires except for the reading circuit are placed.

Let us suppose that an unexpected discontinuity occurs in a matrix signal wire in the photoelectric conversion region. The matrix signal wire is connected to the reading circuit unit in the non photoelectric conversion region and is further led into the reading circuit region in the reading circuit unit. When the unexpected discontinuity is in the matrix signal wire in the photoelectric conversion region, the wire, corresponding to the matrix signal wire, is intentionally cut between the connection of the photoelectric conversion circuit unit to the reading circuit unit and the reading circuit region, i.e., within the non reading region.

The reading circuit unit is made normally by making use of the electric mounting technology including TCP (Tape Carrier Package), HIC (HIBRID IC), etc., and the connection to the photoelectric conversion circuit unit is one using wire bonding or anisotropic conductive film. The cutting method in the non reading region in the reading circuit unit is the method for thermally melting the wire by the laser light using the $CO_2$ gas laser, the YAG laser, the excimer laser or the like, as in Embodiment 1. Alternatively, the portion desired to cut may also be dissolved with an etchant for the metal thin film layer forming the matrix signal wire or may also be shaved off with a sharp edge like a cutter or the like, depending upon circumstances.

In cases where the photoelectric conversion circuit unit includes many pixels, for example, 4000×4000 pixels and the photoelectric conversion apparatus becomes large inevitably, the non reading circuit region in the reading circuit unit may be cut by the laser after all the reading circuit units have been mounted; however, this makes their treatment including handling difficult. Therefore, a way convenient in terms of production is such that each of the photoelectric conversion circuit units is preliminarily inspected singly to check a defective portion (coordinates) of the discontinuity or the like of the matrix signal wires in each photoelectric conversion circuit unit, wires to be connected to the matrix signal wires (coordinates) having the known defective portions are preliminarily cut in the non reading region of the reading circuit units, and they are then mounted as usual.

The operation in the present embodiment is completely the same as in Embodiment 1, and the timing charts for explaining the operation are also similar to those of FIG. 13 to FIG. 15. Therefore, the description thereof is omitted herein.

The present invention can also be applied to the X-ray image pickup apparatus (X-ray detecting apparatus), digital copiers, electronic blackboards, facsimile devices, etc. using the photoelectric conversion apparatus of the present invention described above in place of the conventional photoelectric conversion apparatus, and can also present the like effect in such apparatus.

FIG. 17 shows an applied example in which the photoelectric converter of the present invention is applied to an X-ray diagnosis system as an information processing apparatus.

X rays 6060 emitted from an X-ray tube 6050 are transmitted through the chest 6062 of a patient or an examinee 6061 to be incident to a photoelectric converter 6040 on which a phosphor has been mounted. The incident X rays include the internal information of the patient. Here, the phosphor emits light in response to the incident X rays and the emitted light is photoelectrically converted to obtain the electric information. The electric information is then converted to be digitalized and an image on the electric information is processed by an image processor 6070 to be able to observe on a display 6080 in a control room. This information can be transferred to a remote place, such as a doctor room located in other place or the like, by way of a transmission means such as a telephone line 6090 and displayed on a display 6081 or stored in a storage means such as an optical disk, and this makes it possible to be diagnosed by a doctor in a remote place. Also, this information can be recorded on a film or memory medium 6110 by a data recorder 6100 including a printer, a CD-writer, a floppy disk drive or a memory.

Effect of the Invention

The present invention can solve the problem of the cross-talk in the other signal lines due to the defective wire and can solve the problem of degradation of image quality, for example.

The present invention also solves the problem of making the whole apparatus disabled by even one defective wire, so that the invention can increase the substantial yield of the photoelectric conversion apparatus and accomplish the reduction of cost of the apparatus.

The present invention can provide the inexpensive photoelectric conversion apparatus superior in terms of the image and the yield with suppressing the cross-talk in the other signal wires by interrupting electrical conduction of the signal wire corresponding to the matrix signal wire with a discontinuity in the non photoelectric conversion circuit region in the photoelectric conversion circuit unit or in the non reading circuit region in the reading circuit unit, thus solving the problem that when the defect of the unexpected discontinuity or the like in the matrix signal wire was caused by the unexpected mixture of dust, foreign matter, or the like in the process of producing the photoelectric conversion circuit unit on the same substrate, the output value of photoelectric conversion signal became inappropriate and the output induced the cross-talk in the other signal lines to result in the degradation of image quality and, in turn, the decrease of the yield.

What is claimed is:

1. A photoelectric conversion apparatus comprising:
   a photoelectric conversion circuit unit in which a plurality of photoelectric conversion elements are arrayed in a matrix to form a photoelectric conversion region; and
   a plurality of signal wires for transferring parallel signals outputted from the photoelectric conversion circuit unit to a reading circuit unit;
   wherein, in a signal wire outputting a defective signal, conduction is interrupted in an area outside said photoelectric conversion region, in said signal wire outputting a defective signal to prevent the defective signal from being read by the reading circuit unit.

2. The photoelectric conversion apparatus according to claim 1,
   wherein said reading circuit unit has a reading region and said conduction is interrupted in a wire outputting a defective signal outside said reading region.

3. A photoelectric conversion apparatus comprising:
   a photoelectric conversion circuit unit for outputting parallel signals, in which a plurality of photoelectric conversion elements, switching elements, signal wires, and gate driving wires are placed on a substrate; a driving circuit unit for applying a driving signal to said gate driving wires; and a reading circuit unit for converting the parallel signals transferred through said signal wires to serial signals and outputting the serial signals;
   said photoelectric conversion apparatus having a photoelectric conversion region in which said photoelectric conversion elements are placed and a non-photoelectric conversion region in which said signal wires and said gate driving wires but not said photoelectric conversion elements, are placed on said substrate,
   wherein, in a said signal wire which provides an inappropriate signal out of a plurality of photoelectrically converted signal outputs from said photoelectric conversion region, conduction is interrupted in said signal wire at the non-photoelectric conversion region to prevent said inappropriate signal from being read by the reading circuit unit.

4. The photoelectric conversion apparatus according to claim 3,
   wherein said reading circuit unit has a reading region and said conduction is interrupted in the signal wire outside said reading region.

5. A production method for a photoelectric conversion apparatus, comprising the step of providing a photoelectric conversion apparatus comprising a photoelectric conversion circuit unit for outputting parallel signals, in which a plurality of photoelectric conversion elements, switching elements, and signal wires are placed on one substrate, and a reading circuit unit for converting the parallel signals transferred through said signal wires to serial signals and outputting the serial signals,
   wherein on said substrate there is a photoelectric conversion region in which said photoelectric conversion elements are placed and a non-photoelectric conversion region in which said signal wires are placed,
   said production method of the photoelectric conversion apparatus further comprising a step of interrupting a conduction path of a said signal wire when a signal thereon is inappropriate, wherein said interruption is made outside said photoelectric conversion region to prevent the inappropriate signal from being read by the reading circuit unit.

6. The production method of the photoelectric conversion apparatus according to claim 5,
   wherein said reading circuit unit has a reading region for converting the parallel signals transferred through the matrix signal wires to the serial signals and outputting the serial signals,
   said production method of the photoelectric conversion apparatus further comprising a step wherein said interruption is made outside of said reading region.

7. An information processing apparatus comprising:

a photoelectric conversion circuit unit in which a plurality of photoelectric conversion elements are arrayed in a matrix to form a photoelectric conversion region; and a plurality of signal wires for transferring parallel signals outputted from the photoelectric conversion circuit unit to a reading circuit unit; and a wavelength conversion element disposed on said photoelectric conversion circuit unit, wherein, in a signal wire outputting a defective signal, conduction is interrupted outside said photoelectric conversion region to prevent the defective signal from being read by the reading circuit unit.

8. The information processing apparatus according to claim 7, wherein said reading circuit unit has a reading region and said conduction is interrupted in the wire outputting a defective signal outside said reading region of said reading circuit unit.

9. The information processing apparatus according to claim 7, further comprising a grid plate on said wavelength conversion element.

10. The information processing apparatus according to claim 7, further comprising a recording unit for recording image information.

11. The information processing apparatus according to claim 7, further comprising an image processing device.

12. An information processing apparatus comprising a photoelectric conversion circuit unit for outputting parallel signals, in which a plurality of photoelectric conversion elements, switching elements, signal wires, and gate driving wires are placed on a substrate; and a reading circuit unit for converting the parallel signals transferred through said signal wires to serial signals and outputting the serial signals;

said photoelectric conversion circuit unit having a photoelectric conversion region in which said photoelectric conversion elements are placed, and a non-photoelectric conversion region in which said signal wires and said gate driving wires apart from said photoelectric conversion elements are placed, a wavelength conversion element disposed on said photoelectric conversion circuit unit, wherein, in a signal wire which provides an inappropriate signal, conduction is interrupted in said non-photoelectric conversion region to prevent the inappropriate signal from being read by the reading circuit unit.

13. The information processing apparatus according to claim 12, wherein said reading circuit unit has a reading region, wherein said interruption is made in a non-reading circuit region.

14. The information processing apparatus according to claim 12, further comprising a grid plate on said wavelength conversion element.

15. The information processing apparatus according to claim 12, further comprising a recording unit for recording image information.

16. The information processing apparatus according to claim 12, further comprising an image processing device.

17. A photoelectric conversion apparatus comprising a photoelectric conversion circuit in which a plurality of photoelectric conversion elements are arrayed in a matrix, a plurality of signal wires for transferring output signals from the photoelectric conversion circuit, and a reading circuit to which said output signals are transferred, wherein electrical conduction is interrupted outside the photoelectric conversion circuit in a signal wire providing a defective signal to prevent the defective signal from being read by the reading circuit.

18. The photoelectric conversion apparatus according to claim 17, wherein said defective signal results from a discontinuity of the wire.

19. The photoelectric conversion apparatus according to claim 17, wherein said defective signal results from a high-resistance portion of the signal wire.

20. An information processing apparatus comprising a photoelectric conversion circuit in which a plurality of photoelectric conversion elements are arrayed in a matrix, a plurality of signal wires for transferring output signals from the photoelectric conversion circuit, and a reading circuit to which said output signals are transferred, a wavelength conversion element disposed on the photoelectric conversion apparatus, wherein electrical conduction is interrupted outside the photoelectric conversion circuit in a said signal wire having a defect, prevent a signal thereon from being read by the reading circuit.

21. The information processing apparatus according to claim 20, further comprising a grid plate on said wavelength conversion element.

22. The information processing apparatus according to claim 20, further comprising a recording unit for recording image information.

23. The information processing apparatus according to claim 20, further comprising an image processing device.

24. The information processing apparatus according to claim 20, wherein said wire defect is a discontinuity of the wire.

25. The information processing apparatus according to claim 20, wherein said wire defect is a high-resistance portion.

26. A production method of a photoelectric conversion apparatus comprising the steps of providing a photoelectric conversion circuit in which a plurality of photoelectric conversion elements are arrayed in a matrix, a plurality of signal lines are arranged for transferring output signals from the photoelectric conversion circuit, and a reading circuit is connected to receive said output signals, and the step of interrupting an electrical conduction path outside the photoelectric conversion circuit, in a defective signal line between the photoelectric conversion circuit and the reading circuit to prevent a signal thereon from being read by the reading circuit.

* * * * *